United States Patent [19]

Senga et al.

[11] 4,401,739

[45] Aug. 30, 1983

[54] METHOD FOR TREATING LITHOGRAPHIC PRINTING PLATES (II)

[75] Inventors: Takao Senga; Masafumi Koishi; Yasuo Tsubai, all of Nagaokakyo, Japan

[73] Assignee: Mitsubishi Paper Mills, Ltd., Tokyo, Japan

[21] Appl. No.: 365,089

[22] Filed: Apr. 2, 1982

Related U.S. Application Data

[63] Continuation of Ser. No. 191,017, Sep. 26, 1980, abandoned, which is a continuation of Ser. No. 30,605, Apr. 11, 1979, abandoned.

[30] Foreign Application Priority Data

Apr. 18, 1978 [JP] Japan .................................. 53-45536

[51] Int. Cl.³ .......................... G03C 1/33; G03F 7/06
[52] U.S. Cl. ......................................... 430/16; 430/18; 430/204; 430/271; 430/302; 430/416; 430/531; 101/451; 101/457

[58] Field of Search .................. 430/9, 11, 12, 16, 18, 430/204, 271, 302, 531, 527, 529; 101/457, 451

[56] References Cited

U.S. PATENT DOCUMENTS

| | | | |
|---|---|---|---|
| 2,493,838 | 1/1950 | Terry | 430/621 X |
| 3,819,374 | 6/1974 | Kemp | 430/12 |
| 3,971,660 | 7/1976 | Staehle | 430/18 |
| 4,160,670 | 7/1979 | Tsubai | 430/204 |

*Primary Examiner*—John D. Welsh
*Attorney, Agent, or Firm*—Cushman, Darby & Cushman

[57] ABSTRACT

Printing characteristics such as ink receptivity and printing endurance of a lithographic printing plate which utilizes as ink receptive areas the photographically formed silver or silver halide image can be improved by treating said printing plate in the presence of a polymer compound containing in its principal and/or side chain an aromatic nucleus bearing a hydrophilic substituent group, said printing plate containing in at least one of its constitutive layers as hydrophilic high molecular weight-binder.

10 Claims, No Drawings

METHOD FOR TREATING LITHOGRAPHIC PRINTING PLATES (II)

CROSS-REFERENCE TO RELATED APPLICATIONS

This application is a continuation of our earlier application Ser. No. 191,017 filed Sept. 26, 1980, which in turn is a continuation of our earlier application Ser. No. 30,605 filed Apr. 11, 1979, both of which are now abandoned.

BACKGROUND OF THE INVENTION

This invention relates to lithographic printing plates, particularly those in which the imaged silver or silver halide areas formed by photographic processes are employed as ink-receptive areas. It relates also to a method of treating such lithographic printing plates.

The lithographic printing plate consists of oleophilic image areas which are receptive to greasy ink and oleophobic non-image areas which are ink repellent. The non-image areas generally consist of hydrophilic areas which are receptive to water. Accordingly, common lithographic printing is performed by supplying both ink and water to the printing plate, whereby the image areas and the non-image areas selectively accept the chromatic ink and water, respectively, and then transferring the ink on the image areas to a substrate such as, for example, paper. Therefore, in order to obtain good print copies it is necessary that there is a sufficient difference in the surface behavior of image areas and non-image areas with respect to oleophilicity and hydrophilicity so that when an ink and water are supplied to the printing plate surface, the image areas may accept the ink in sufficient quantities while the non-image areas may repel the ink completely. Retention of such a difference over a long period of time by the printing plate after its preparation is important also from the commercial viewpoint.

In the graphic art, there have been known various materials for lithographic printing, methods of production thereof and methods of conversion thereof to printing plates. For instance, there are printing plates comprising diazo-sensitized organic colloids supported on metallic plates such as aluminum (PS plates), printing plates utilizing electrophotography, and printing plates involving silver salt photographic processes. These printing plates are now in actual use combined with suitable processing and printing techniques such as oil-desensitizing, dampening, etc., suitable for each type of printing plate.

Photographic elements comprising silver halide emulsion layers having high photosensitivity and capable of being spectrally sensitized are suitable for the automatic production of printing plates and are already in actual use in several forms.

Typical known methods for making lithographic printing plates by utilizing photosensitive gelatino silver halide emulsions may be broadly classified into the following groups:

(1) methods which involve tanning development of hydrophilic gelatino silver halide emulsions to harden the gelatin in the developed areas, thus making it oleophilic and receptive to greasy printing ink (U.S. Pat. No. 3,146,104);

(2) methods which utilize the silver diffusion transfer process to make the metallic silver pattern formed on the surface oleophilic and ink receptive [U.S. Pat. Nos. 3,721,559 and 3,490,905; Japanese Patent Post-examined Publication 30,562/73; A. Rott and L. Dehaes, J. Phot. Sci., Vol. 8, pp. 26–32 (1960)];

(3) methods utilizing the etching bleach process, which comprise treating with a bleach solution the silver image areas formed on development or transfer development, whereby the gelatin in the silver pattern area is destroyed at the same time to expose the oleophilic layer (U.S. Pat. Nos. 3,385,701 and 3,814,603; Japanese Patent Post-examined Publication 27,242/69); and (4) methods in which undeveloped silver halide image areas in the developed hydrophilic gelatin-silver halide emulsion layer are selectively rendered oleophilic and thus ink receptive (U.S. Pat. Nos. 3,454,398, 3,764,323 and 3,099,209; Japanese Patent Application 84,164/76).

In the methods of (1), the hardened gelatin layer on the surface of printing plate is rendered ink receptive, whereas in the methods of (2) and (4), generally the silver or silver halide on the surface of lithographic printing plate is utilized as ink receptive areas, said silver or silver halide, in most of the cases, being subjected to some treatment or other such as, for example, with a mercapto compound as disclosed in Japanese Patent Post-examined Publications 29,723/73 and 486/76 to enhance oleophilicity, that is, ink receptivity or to convert into ink receptive.

There is a persistent demand for further improvement in printing characteristics such as ink receptivity, anti-staining property, and printing endurance of any lithographic printing plate, not excepting the above-said one which utilizes as ink receptive area the silver or silver halide image formed by photographic processes.

SUMMARY OF THE INVENTION

An object of this invention is to improve ink receptivity and moreover printing endurance of the lithographic printing plate which utilizes imaged silver or silver halide as ink receptive area. The "printing endurance" as herein referred to means the ability of the printing plate to withstand repeated printing without causing unsatisfactory ink receipt, stain or disappearance of images.

In the course of studies on the printing plate which employs the silver complex diffusion transfer process disclosed fundamentally in Japanese Patent Post-examined Publications 16,725/73 and 30,562/73, the present inventors found that a polymer compound having a specific structure may advantageously achieve the object of this invention. The said polymer compound with a specific structure is a polymer compound containing in its principal or side chain an aromatic nucleus having a hydrophilic substituent group.

This invention pertains to a method of treating a lithographic printing plate containing at least one hydrophilic high-molecular binder in the presence of the above-noted polymer compound throughout the course of making the printing plate and the printing operation.

DESCRIPTION OF THE INVENTION AND THE PREFERRED EMBODIMENTS

The object of this invention is achieved, in the printing plate which employs the photographically formed silver or silver halide image as ink receptive area, by the inclusion of hydrophilic high molecular binder for prevention of stain and in addition the above-noted polymer compound in the constitutive layers having said silver or silver halide image and/or inclusion of said polymer compound in at least one of the processing solutions used in the printing plate making step subsequent to imagewise exposure of the printing plate and in the printing operation, such as developer solution, neutralizing solution, fixing solution, oil-desensitizing solution, fountain solution and conversion solution as used in the Examples hereinafter.

The aromatic nuclei of the polymer compounds used in the method of this invention include those of benzene, naphthalene, phenanthrene, anthracene, pyrene and naphthacene. Of these, benzene and napthalene nuclei are most preferred. The aromatic nucleus needs to contain at least one hydrophilic substituent group such as, for example, sulfonic acid group, hydroxyl group, carboxyl group, quaternary ammonium group, phosphoric acid group, or a salt thereof. The sulfonic acid group is most preferable. Other substituent groups such as alkyl groups, aryl groups and nitro group may also be present in addition to the hydrophilic substituent group.

Typical examples of the polymer compound for use in the method of this invention are listed below.

(1)
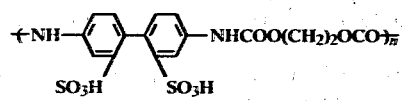

(2)
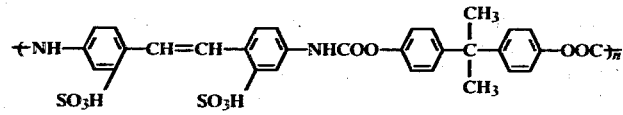

(3)
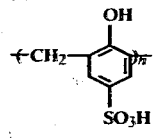

(4)
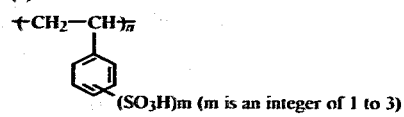

(5)
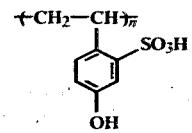

(6)
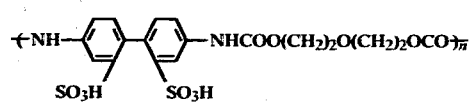

(7)
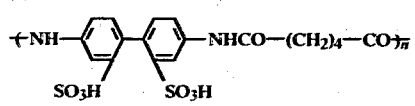

(8)
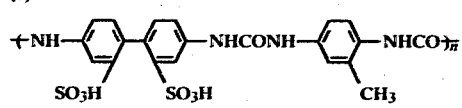

(9)
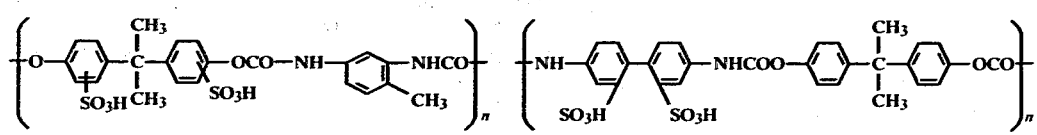

(10)
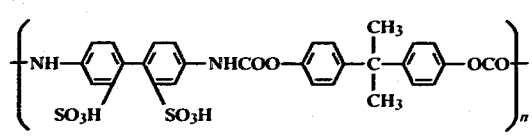

(11)
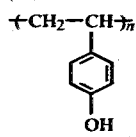

(12)
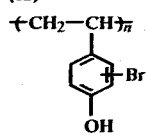

(13)
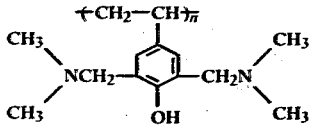

(14)
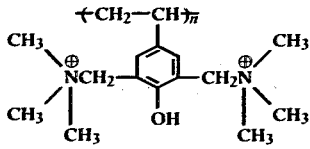

(15)
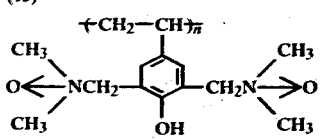

(16)
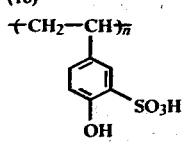

(17)

(18)

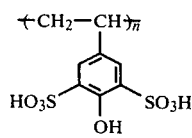

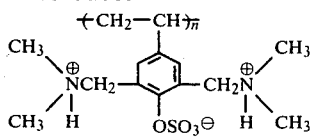

(19)

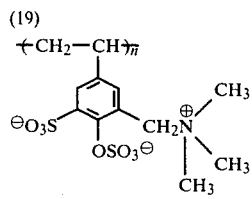

(20)

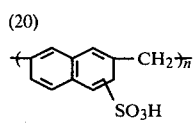

(21)

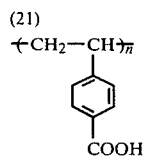

(22)

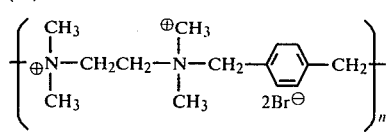

In the above formulas, n is an integer greater than 2 inclusive. Therefore, the average polymerization degree of the polymer compound for use in this invention is 2 to 10,000, preferably 5 to 1,000, though not limitative.

Examples of printing plates suitable for the method of this invention are those of the positive or negative working type (direct positive silver halide emulsion is used in the photosensitive layer) which employs the silver image as ink receptive area, such as those described in Japanese Patent Post-examined Publications 16,725/73, 29,446/76, 30,562/73, 15,764/76, 16,803/76; Japanese Utility Model Pre-examined Publications 5,801/73, 43,002/74; Japanese Patent Pre-examined Publications 111,103/76, 139,401/76; U.S. Pat. Nos. 3,721,559, 3,490,905; Japanese Patent Applications 22,829/76, 27,095/76, 95,276/76, 95,274/76, 131,371/76 or those which employs the silver halide image as ink receptive area, such as those described in U.S. Pat. Nos. 3,454,398, 3,764,323, 3,099,209; Japanese Patent Pre-examined Publication 46,002/72; Japanese Patent Applications 84,164/76, 14,965/77. The method of this invention is applicable to not only the above-noted printing plates but also to those which employ as the ink receptive area the silver or silver halide image formed by the photographic processes such as silver complex diffusion transfer processes, physical development processes, chemical development processes or combinations of these processes.

The surface layer of these lithographic printing plates (photographic elements) is a physical development nuclei containing layer, physical development nuclei supporting layer or silver halide emulsion layer which will become an ink repellent layer of the printing plate after being processed. The surface layer generally contains one or two hydrophilic high molecular binders such as gelatin (including alkali-treated gelatin, acid-treated gelatin, grafted gelatin, acylated gelatin and other modified gelatins), starches, albumin, sodium alginate, hydroxyethylcellulose, gum arabic, polyvinyl alcohol, polyvinylpyrrolidone, carboxymethylcellulose, polyacrylamide, styrene-maleic anhydride copolymer, polyvinyl methyl ether-maleic anhydride copolymer, etc.

Amount of the high molecular weight binder contained in the physical development nuclei layer of the lithographic printing plate described fundamentally in Japanese Patent Post-examined Publications 16,725/73 and 30,562/73 must be small because the particles of physical development nuclei must protrude from the free surface. The method of this invention is effectively applicable especially to such a lithographic printing plate.

In practising this invention, the specified polymer compound is incorporated in those constitutive layers of the lithographic printing plate such as physical development nuclei containing layer, silver halide emulsion layer etc., which contain hydrophilic high molecular binder and in which ink receptive imaged silver or silver halide is to be formed. If the hydrophilic high molecular binder listed above or a hydrophilic synthetic polymer described in U.S. Ser. No. 822191 or the polymer compound as specified herein is used independently in separate layers, the object of this invention cannot be sufficiently achieved and causes unsatisfactory ink receipt or, in some cases, marked stain. Although the unsatisfactory ink receipt and the stain are apparently inconsistent phenomena, yet in the lithographic printing plate operating on the basis of a delicate balance between ink receptivity and ink repellency, some specific compounds sometimes exhibit dual effects. For instance, although known to be able to hydrophilize the metallic support of a presensitized plate (Japanese Patent Post-examined Publication 23,982/64), the exemplified polymer compound (4), when used in the lithographic printing plate according to this invention, can enhance also the ink receptivity and sufficiently increase the difference between ink receptivity and ink repellency, rendering the printing plate to maintain favorable balance between both, thereby to retain desirable ink receptivity and an anti-stain property even after a large number of copies have been printed.

The photographic elements suitable for the method of this invention contain a photosensitive silver halide photographic emulsion layer and the lithographic printing plate made from such photographic elements employs silver or silver halide as ink receptive site. The said silver halide photographic emulsion layer can be prepared by conventional processes well known in the art and some methods for improving the emulsion layer to become particularly suitable for making printing plate can be found in the literature.

In practising this invention, the specified polymer compound is previously incorporated in the hydrophilic high molecular binder-containing constitutive layers of the lithographic printing plate. When the printing plate is prepared by utilizing silver complex diffusion transfer, it is particularly preferable to incorporate the specified polymer compound in at least a layer containing physical development nuclei (heavy metals or sulfides thereof). In the case of printing plate utilizing a silver halide as ink receptive site, it is desirable to incorporate the polymer compound in the silver halide emulsion.

The incorporation of the specified compound in the constitutive layers of the printing plate is advantageously carried out by dissolving the compound in water or water-miscible organic solvents such as methanol, propanol and acetone and adding the resulting solution to the coating composition prior to application. The amount of the specified compound to be incorporated in the lithographic printing plate cannot be specified unconditionally, because it depends on various factors such as the type of polymer compound, printing plate material and the constitutive layer in which the polymer compound is incorporated. A suitable but non-limitative amount is in the range of about $10^{-4}$ to about 1 g, preferably about $10^{-3}$ to about $10^{-1}$ g per square meter of the printing plate. A rough measure for the weight ratio to the hydrophilic high molecular binder is 0.01 to 10, preferably 0.02 to 5.

The photographic element to be treated according to this invention is generally treated, after imagewise exposure, with an alkaline developer, then, if necessary, with neutralizing solution, fixing solution, oil-desensitizing solution, etching solution, fountain solution and other treating solutions generally used in the printing plate processing and in the printing operation.

The developer may be any of the common photographic alkaline developing solutions containing developing agents such as hydroquinone, developing solutions for silver diffusion transfer development containing a thiosulfate, and activated high-alkali developers. The difference between the oleophilicity and hydrophilicity in the imaged area and non-imaged area can be increased by use of a developing solution containing an organic compound with mercapto or thione group as substituent or a heterocyclic compound with sulfur as hetero atom, as disclosed in Japanese Patent Post-examined Publication 486/76 and Japanese Patent Application 67,409/76.

The compositions of neutralizing solution, fixing solution, oil-desensitizing solution, etching solution and fountain solution suitable for the purpose of use and the type of printing plate material are well known to those skilled in the art. It is preferable to modify the activity of treating solutions by adding conventionally known additives such as the above-noted organic mercapto compound, oil-desensitization accelerator, buffer agent, preservative and wetting agent. Examples of such additives include gum arabic, carboxymethylcellulose, sodium alginate, vinylpyrrolidone, vinylimidazole, copolymers of methyl vinyl ether and maleic anhydride, carboxymethylstarch, ammonium alginate, alginic acidoxidized cellulose, methylcellulose, sulfates (sodium sulfate, ammonium sulfate, etc.); phosphoric acid, nitric acid, nitrous acid, tannic acid, and salts thereof; polyol compounds having two or more hydroxyl groups (polyethylene glycol, propylene glycol, pentaerythritol, glycerol, diethylene glycol, hexyleneglycol), organic weak acids (citric acid, succinic acid, tartaric acid, adipic acid, ascorbic acid, propionic acid), inorganic fine particles (colloidal silica or alumina), polyacrylic acid, ammonium dichromate, chrome alum, propylene glycol alginate, salts of aminopolycarboxylic acids (e.g. sodium ethylenediaminetetraacetate), and surface active agents. By the addition of one or more of these additives, there will be obtained more suitable treating solutions for use in printing plate making and printing operation to achieve the object of this invention. Beside the above-listed additives, water-miscible organic solvents such as methanol, dimethylformamide and dioxane and very small amounts of coloring substances such as phthalocyanine dyes, malachite green and ultramarine may be added, said coloring substances being used for the purposes of identifying the solution and improving the aesthetic appearance.

In one of the embodiments of this invention, the specified polymer compound is added to at least one of the treating solutions for use in printing plate making and printing operation. Although the amount to be added of said compound depends upon the type or composition of the treating solution and the type of printing plate material, it is approximately in the range of $10^{-3}$ to 50 g, preferably $10^{-2}$ to 10 g per liter of the treating solution. This is only a rough criterion and the polymer compound can be used in an amount outside the range, as the case may be. The optimal amount should be selected so as to keep balance with the quantity of hydrophilic high molecular binder in the printing plate and the quantity of ink repellent substances (oil-desensitizing substances) in the treating solution. It seems that the specified polymer compound in treating solutions migrate into the constitutive layers of the printing plate and exhibits substantially the same effect as when previously incorporated in the layer.

The invention is illustrated below in detail with reference to Examples.

EXAMPLE 1

On one side of a paper support coated on both sides with 135 g/m² of polyethylene, was provided a matting layer containing silica particles, 5μ in average size. On the other side, which had been treated with corona discharge, was provided an antihalation layer containing carbon black. The antihalation layer was then coated with 1.0 g/m² (in terms of silver nitrate) of an orthochromatically sensitized high-contrast silver chlorobromide emulsion containing silica particles of 5μ average size. The antihalation and emulsion layers contained formaldehyde as hardeners. After drying, the photosensitive element thus obtained was heated at 40° C. for 3 days. The emulsion layer of the element was then overcoated at a rate of 5 m/minute with a hardenable palladium sol prepared in the following way:

| Solution A: | |
|---|---|
| PdCl₂ | 5 g |
| HCl | 40 ml |
| Water | 1 liter |
| Solution B: | |
| Na₂S | 8.6 g |
| Water | 1 liter |

Solutions A and B were mixed with stirring for 30 minutes, then purified by passing through a column packed with ion exchange resins for purifying water, and admixed with Solution C to obtain the coating sol (comparative sample A).

| Solution C | |
|---|---|
| Methyl vinyl ether-maleic anhydride copolymer | 1 g |
| 10% Aqueous saponin solution | 200 ml |
| Water | 18,000 ml |

The above procedure was repeated to prepare 11 samples, except that varying amounts of different polymers as shown in Table 1 were used in solution C in place of or in addition to the methyl vinyl ethermaleic anhydride copolymer.

The photographic element for printing plate thus obtained was exposed imagewise in a letterpress camera provided with image reversal mechanism and developed with the following silver complex diffusion transfer developer at 30° C. for 60 seconds:

| Transfer Developer: | |
|---|---|
| Water | 1,500 ml |
| Sodium hydroxide | 20 g |
| Anhydrous sodium sulfite | 100 g |
| Hydroquinone | 12 g |
| 1-Phenyl-3-pyrazolidone | 1 g |
| Sodium thiosulfate | 16 g |
| Potassium bromide | 3 g |
| 1-Ethyl-2-mercaptobenzimidazole | 0.05 g |
| 3-Mercapto-4-acetamido-5-n-heptyl-1,2,4-triazole | 0.1 g |
| Water to make up to | 2 liters |

After development, the photographic element was squeezed between two squeeze rolls to remove the excess developer, then immediately treated in a neutralizing solution of the following composition at 25° C. for 20 seconds, removed of the excess liquid by passing through squeeze rolls, and dried at atmospheric temperature and humidity.

| Neutralizing solution: | |
|---|---|
| Water | 600 ml |
| Ethylene glycol | 5 g |
| Colloidal silica (20% aqueous solution) | 1 g |
| Citric acid | 10 g |
| Sodium citrate | 35 g |
| Water to make up to | 1 liter |

The lithographic printing plate thus prepared was mounted on an offset press and rubbed thoroughly on the printing surface with the following oil-desensitizing solution. Using the following fountain solution, printing was performed.

| Oil-desensitizing solution: | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| Fountain solution (before using, ten-fold with water): | |
| Water | 880 ml |
| Succinic acid | 6 g |
| Boric acid | 8.4 g |
| Sodium sulfate, anhydrous | 25 g |
| Cobalt chloride, hexahydrate | 2.5 g |

The printing press used as A. B. Dick 350 CD (trademark of an offset press supplied by A. B. Dick Co.) and the stain, printing endurance and ink receptivity were evaluated in the following manner:

(1) Evaluation of stain: The feeding of paper sheets was started as soon as the inking roll was brought into contact with the surface of printing plate. Using F Gloss Sumi (Tradename for printing ink produced by Dainippon Ink and Chemical Co.), printed copies obtained after 50 and 1,000 impressions has been made were evaluated for the degree of stain which was expressed in the following way:

o No stain at all.
Δ Partial stain or light stain all over the printing plate.
x Heavy stain all over the printing plate.

(2) Printing endurance: Printing was further continued after 1,000 copies had been obtained and the number of copies was counted until stain or unsatisfactory ink receipt was detected. The results of evaluation were expressed in the following way:

o 3,000 copies or more.
Δ 1,000 to 3,000 copies.
x Less than 1,000 copies.

(3) Ink receptivity: Feeding of paper was started as soon as simultaneously with a roller having ink was brought into contact with surface of printing plate and the number of copies required before a print copy having good image density began to be obtained.

The results obtained were as shown in Table 1.

TABLE 1

| Sample | | MVM* | Wt. of polymer in Solution C (g) Polymer compd. (4) | Stain 50th copy | Stain 1,000th copy | Printing endurance | Ink receptivity (the number of copies) |
|---|---|---|---|---|---|---|---|
| Comparative sample | A | 1 | — | o | o | Δ stain | 45 |
| | B | 3 | — | o | o | Δ stain; ink receipt | 50 |
| | C | 9 | — | o | o | x ink receipt | 50 |
| | D | — | 1 | o | Δ | Δ stain | 40 |
| | E | — | 3 | Δ | x | x stain; ink receipt | 40 |
| | F | — | 9 | Δ | Δ | x stain; ink receipt | 50 |
| Sample | 1 | 1 | 0.5 | | | | 10 |
| | 2 | 3 | 0.5 | | | | 10 |
| | 3 | 9 | 0.5 | o | o | o | 15 |
| | 4 | 1 | 1.5 | | | | 10 |
| | 5 | 3 | 1.5 | | | | 10 |

The resulting photosensitive material was optically exposed to the original by use of a process camera provided with image reversal mirror.

The exposed photosensitive material was developed in D-72 developer solution at 25° C. for 30 seconds. The excess developer solution was removed by squeezing and the material was immersed in a conversion solution of the following composition which is used for converting silver image into oleophilic and ink receptive image, at 25° C. for 30 seconds. The photographic material was squeezed and dried to obtain a printing plate.

| | |
|---|---|
| Water | 600 ml |
| Potassium thiocyanate | 20 g |
| Citric acid | 10 g |
| Sodium citrate | 35 g |
| 2-Mercapto-5-propyl-1,3,5-oxadiazole | 1.0 g |
| Isopropyl alcohol | 200 ml |
| Water to make up to | 1 liter |

The same procedure as described above was repeated, except that each of the exemplified polymer compounds (3), (4), (11), (13), (17) and (20) was added to the conversion solution in an amount of 2 g/liter. Each of the lithographic printing plates thus obtained was mounted on a lithographic printing press as in Example 1 and, after wetting the plate surface with water, the machine was set in operation.

The printing plates treated with a conversion solution containing the exemplified polymer compound produced more print copies with improved ink receiptivity and without stain, as compared with those treated with a conversion solution not containing said compound.

What is claimed is:

1. A method for improving printing characteristics of lithographic printing plates having an image of silver per se formed by the silver diffusion transfer process as the ink receptive areas, at least one of the constitutive layers of said plates containing a hydrophilic high molecular weight binder in addition to a second polymer, said method comprising using a polymer compound in at least one location selected from the group consisting of:
   (i) at least one of the hydrophilic high molecular weight binder-containing constitutive layers of said plates which has said image of silver or silver halide;
   (ii) at least one of the processing solutions used in the printing plate making process; and
   (iii) at least one of the processing solutions used in a printing operation, provided in (ii) and (iii) that said hydrophilic high molecular weight binder and said polymer compound are ultimately present in the same layer, said polymer compound containing in its principal and/or side chain an aromatic nucleus bearing a hydrophilic substituent group,
   wherein the aromatic nucleus is benzene, naphthalene, phenanthrene, anthracene, pyrene or naphthacene, and the hydrophilic substituent is a sulfonic acid group, a hydroxyl group, a carboxyl group, a quaternary ammonium group, a phosphoric acid group or a salt thereof.

2. A method according to claim 1 wherein the polymer compound is incorporated in a hydrophilic high molecular binder-containing layer of the printing plate.

3. A method according to claim 1 wherein the polymer compound is present in any of the treating solutions used in the printing plate making process or in the printing operation.

4. A method according to claim 1 wherein the constitutive layer containing the polymer compound is a physical development nuclei-containing layer.

5. A method according to claim 1 wherein the hydrophilic substituent group is a sulfonic acid group.

6. A method according to claim 1 wherein the aromatic nucleus is a benzene nucleus or a naphthalene nucleus.

7. A method according to claim 2 wherein the polymer compound is present in an amount of $10^{-4}$ g to 1 g per square meter of printing plate.

8. A method according to claim 7 wherein the polymer compound is present in an amount of $10^{-3}$ g to $10^{-1}$ g per square meter of printing plate.

9. A method according to claim 3 wherein the polymer compound is present in an amount of $10^{-3}$ g to 50 g per liter of the treating solution.

10. A method according to claim 9 wherein the aromatic hydrocarbon compound is present in an amount of $10^{-2}$ g to 10 g per liter of the treating solution.

* * * * *